US007646427B2

(12) United States Patent
Sato et al.

(10) Patent No.: US 7,646,427 B2
(45) Date of Patent: Jan. 12, 2010

(54) IMAGE CAPTURE APPARATUS

(75) Inventors: Tsuneo Sato, Saitama (JP); Atsuhiko Ishihara, Saitama (JP); Hiroshi Yamasako, Saitama (JP); Youichi Sawachi, Saitama (JP); Takao Kiuchi, Saitama (JP); Naoya Iwata, Saitama (JP)

(73) Assignee: Fujifilm Corporation, Tokyo (JP)

( * ) Notice: Subject to any disclaimer, the term of this patent is extended or adjusted under 35 U.S.C. 154(b) by 724 days.

(21) Appl. No.: 11/091,403

(22) Filed: Mar. 29, 2005

(65) Prior Publication Data

US 2005/0219399 A1 Oct. 6, 2005

(30) Foreign Application Priority Data

Mar. 30, 2004 (JP) ............... 2004-100654

(51) Int. Cl.
*H04N 5/225* (2006.01)
(52) U.S. Cl. ..................................... 348/374
(58) Field of Classification Search ................ 348/340, 348/373, 374, 375
See application file for complete search history.

(56) References Cited

U.S. PATENT DOCUMENTS

| | | | | | |
|---|---|---|---|---|---|
| 3,440,340 | A | * | 4/1969 | Sugihara ....................... 386/44 |
| 3,594,068 | A | * | 7/1971 | Kirstein et al. .............. 359/826 |
| 4,651,218 | A | * | 3/1987 | Fazioli ........................ 348/826 |
| 5,153,734 | A | * | 10/1992 | Kanamori et al. ........... 348/340 |
| 5,268,764 | A | * | 12/1993 | Kihara et al. ................ 348/245 |
| 6,476,856 | B1 | * | 11/2002 | Zantos ........................ 348/151 |
| 6,654,064 | B2 | * | 11/2003 | Ishikawa ..................... 348/374 |
| 6,678,001 | B1 | * | 1/2004 | Elberbaum .................. 348/373 |
| 6,680,748 | B1 | * | 1/2004 | Monti ...................... 348/220.1 |
| 6,738,570 | B2 | * | 5/2004 | Shinohara et al. ............. 396/25 |
| 2001/0010562 | A1 | * | 8/2001 | Nakagishi et al. ........... 348/374 |
| 2001/0030276 | A1 | * | 10/2001 | Hoshino .................. 250/208.1 |
| 2001/0050717 | A1 | * | 12/2001 | Yamada et al. ............. 348/340 |
| 2001/0050721 | A1 | * | 12/2001 | Miyake ...................... 348/374 |
| 2001/0051046 | A1 | * | 12/2001 | Watanabe et al. ........... 396/287 |
| 2002/0006687 | A1 | * | 1/2002 | Lam ........................... 438/118 |
| 2002/0057468 | A1 | * | 5/2002 | Segawa et al. .............. 358/509 |
| 2003/0112364 | A1 | | 6/2003 | Tanida et al. |
| 2003/0218251 | A1 | * | 11/2003 | Seo ............................ 257/737 |
| 2004/0021792 | A1 | * | 2/2004 | Yasui ......................... 348/373 |
| 2004/0027477 | A1 | * | 2/2004 | Tamura et al. .............. 348/340 |
| 2005/0001905 | A1 | * | 1/2005 | Shinomiya ............. 348/207.99 |
| 2005/0185088 | A1 | * | 8/2005 | Kale et al. .................. 348/374 |

\* cited by examiner

*Primary Examiner*—Sinh Tran
*Assistant Examiner*—Dillon Durnford-Geszvain
(74) *Attorney, Agent, or Firm*—McGinn IP Law Group, PLLC

(57) ABSTRACT

A mounting board of a camera module of a mobile phone is screwed to an outer cover through cushions formed of rubber, sponge or the like. A solid state imaging device and an optical unit of the camera module are contained in an opening formed in the outer cover and do not contact the outer cover. The mounting board is connected to a main substrate through a flexible board. Accordingly, even if the mobile phone is dropped down, the camera module is prevented from breakage by the vibration or the shock applied to the mobile phone, because the vibration and the shock are not transmitted to the camera module directly.

14 Claims, 5 Drawing Sheets

IMAGE CAPTURE APPARATUS

BACKGROUND OF THE INVENTION

1. Field of the Invention

The present invention relates to an improvement of an image capture apparatus which captures subject images with a solid state imaging device.

2. Description Related to the Prior Art

A mobile phone which incorporates a digital camera so as to easily capture images is in widespread use. For example, U.S. patent application Publication 2003/0112364 discloses a camera module, which is formed such that a solid state imaging device, an optical unit incorporating an image taking optical system and a mounting board having a control circuit thereon are preassembled as a unit, for being easily incorporated in a small electronic apparatus such as a mobile phone.

The solid state imaging device comprises a bare chip obtained such that a light receiving portion and electrode pads are formed on a semiconductor substrate made of silicon, a package for containing the bare chip, and a cover glass for sealing an opening of the package without blocking incidence of light toward the light receiving portion. The bare chip and the package are connected by wire bonding. In the camera module, the solid state imaging device is soldered on the mounting board, and the optical unit is fixed on the package or the mounting board with adhesive.

As a packaging method to downsize the solid state imaging device, a wafer-level chip size package (hereinafter WLCSP) is known. In the WLCSP, a semiconductor device is obtained by dicing a wafer after packaging in a semiconductor wafer process. The WLCSP can drastically reduce the size of a solid state imaging device in comparison with the conventional ceramic packaging.

However, the mobile phone is often handled more roughly than a digital camera and so on, therefore hard vibration and impacts are frequently applied to the mobile phone. The traditional camera module is attached to a frame of the mobile phone. An outer cover of the mobile phone is also attached to the frame, therefore when the mobile phone is dropped down, the impact is transmitted to the camera module from the outer cover through the frame. In the traditional camera module, such an impact often breaks the attachment of the optical unit or solder between the solid state imaging device and the mounting board.

In addition, the solid state imaging device of WLCSP type is very small, and so is the attachment area between the solid state imaging device and the optical unit. Therefore, there is a problem that the attachment strength is insufficient to endure the vibration or the impact on the mobile phone.

SUMMARY OF THE INVENTION

An object of the present invention is to prevent breakage of a camera module by vibration or impact applied thereto.

In order to achieve the object, in an image capture apparatus of the present invention, a camera module is attached to an outer cover through a cushion. Preferably, the cushion is provided between a mounting board on which a solid state imaging device is mounted and the outer cover, and the solid state imaging device and an optical unit are placed not to contact the outer cover. It is also preferable that the camera module is covered by the cushion without blocking an optical path of the optical unit, and a portion of the cushion is attached to the outer cover. In addition, the mounting board connects to another electronic component which is mounted inside the outer cover, for example on a frame, through a flexible wiring.

According to the image capture apparatus of the present invention, since the vibration or the impact applied to the outer member is absorbed by the cushion, the camera module is protected from their influence. In addition, since the solid state imaging device and the optical unit do not contact the outer cover, these members are prevented from breakage by the vibration or the shock applied to the outer cover.

In case that the camera module is covered with the cushion which is then attached to the outer cover, whole of the camera module can be protected from the vibration and the shock because the cushion floats the whole of the camera module on the outer cover. In addition, because the mounting board connects the other electronic component through the flexible wiring, when the vibration or the shock is applied to the outer cover, the vibration or the shock can not be transmitted to the camera module from the electronic component, even if it is transmitted to the electronic component from the outer cover.

BRIEF DESCRIPTION OF THE DRAWINGS

The above objects and advantages of the present invention will become easily understood by one of ordinary skill in the art when the following detailed description would be read in connection with the accompanying drawings.

PREFERRED EMBODIMENTS OF THE INVENTION

Figure 1:
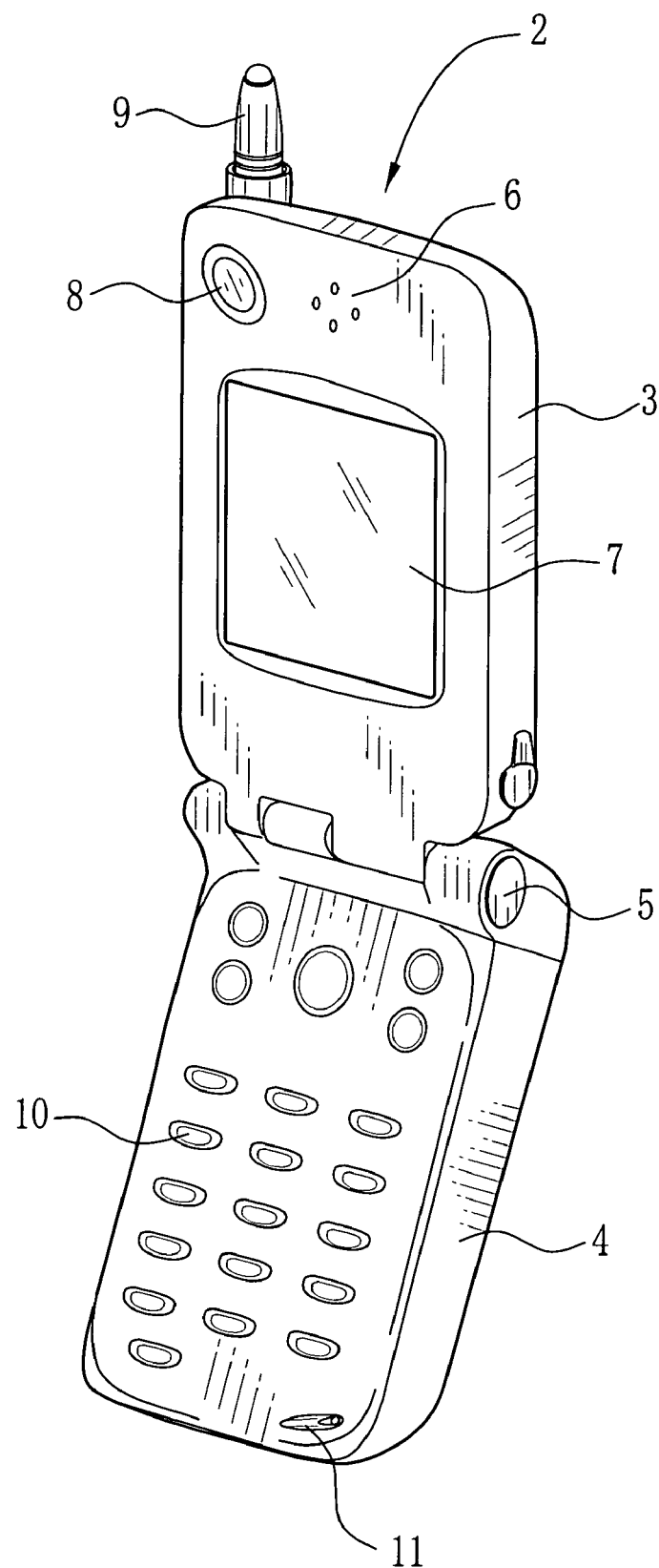
FIG. 1 is a perspective view of a mobile phone to which the present invention is applied.

As shown in FIG. 1, a mobile phone 2 comprises a receiver unit 3 and a transmitter unit 4, which are connected by a hinge 5 in a foldable manner. The receiver unit 3 provides a voice output section 6 for outputting received voice which is amplified, a display panel 7 for displaying various information, an image capturing section 8 for capturing subject images, and an antenna 9. The transmitter unit 4 provides operation buttons 10 for operating the mobile phone 2, and a voice input section 11 for inputting voice for transmission.

Figure 2:
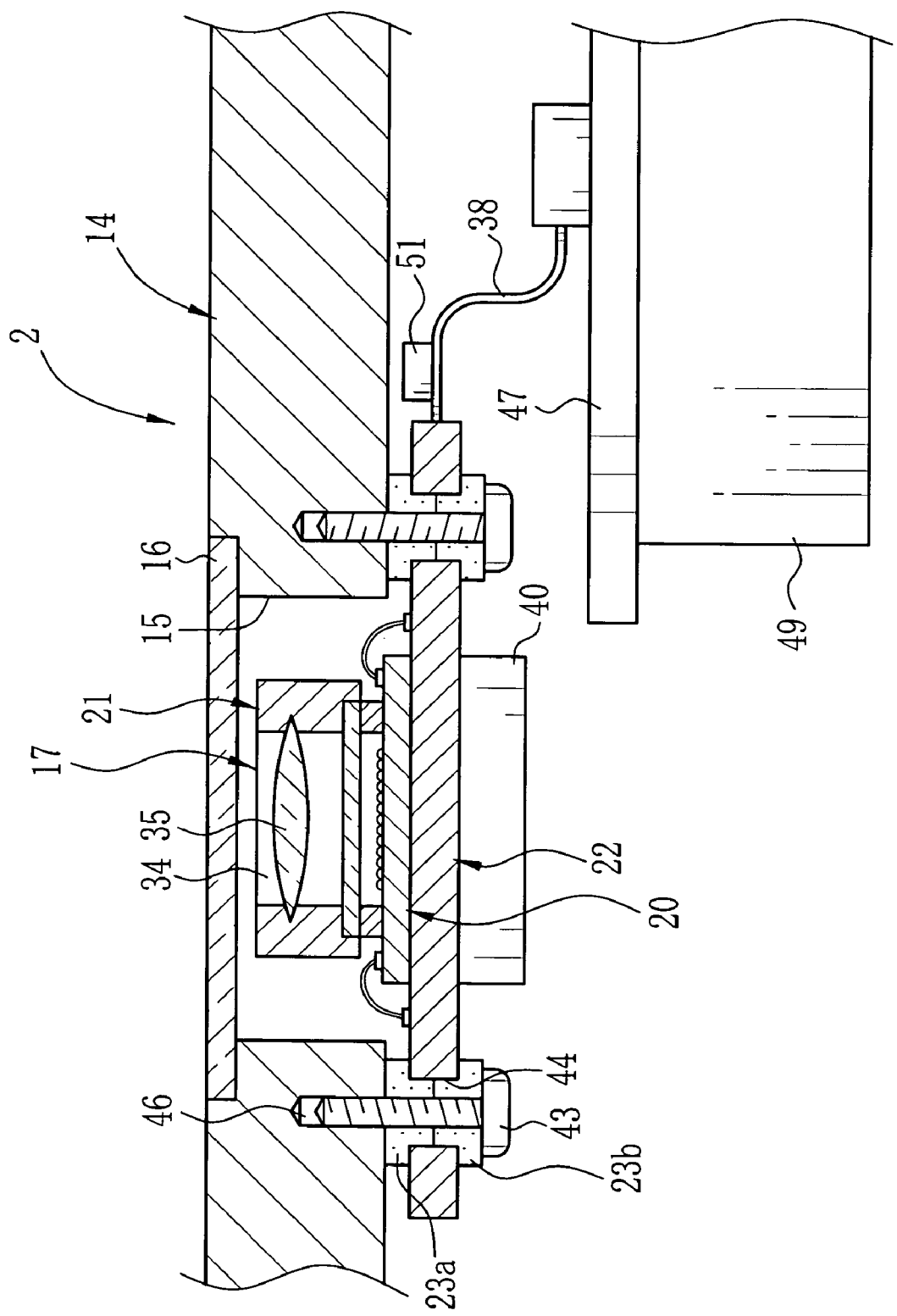
FIG. 2 is a partially sectional view of an image capturing section of the mobile phone.
Figure 3:
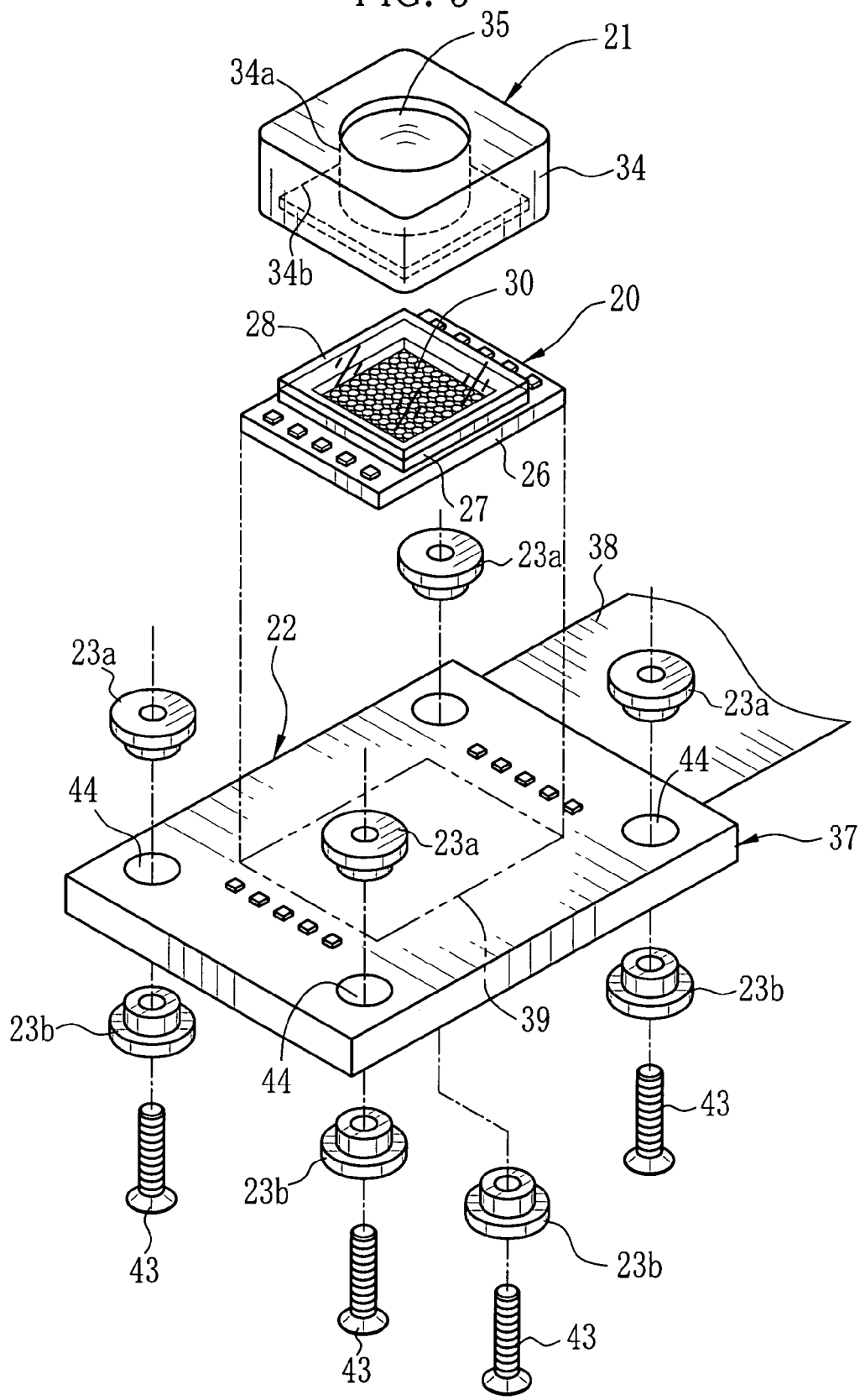
FIG. 3 is an exploded perspective view of a camera module.

As shown in FIG. 2, an outer cover 14 of the mobile phone 2 has an opening 15 for image capturing. The opening 15 is covered by a protection plate 16 which is formed of transparent plastic or the like. Below the opening 15, a camera module 17 is attached to the outer cover 14 through a plurality of cushions 23. As shown in FIG. 3, the camera module 17 comprises a solid state imaging device 20 of WLCSP type, an optical unit 21, and a mounting board 22.

Figure 4:
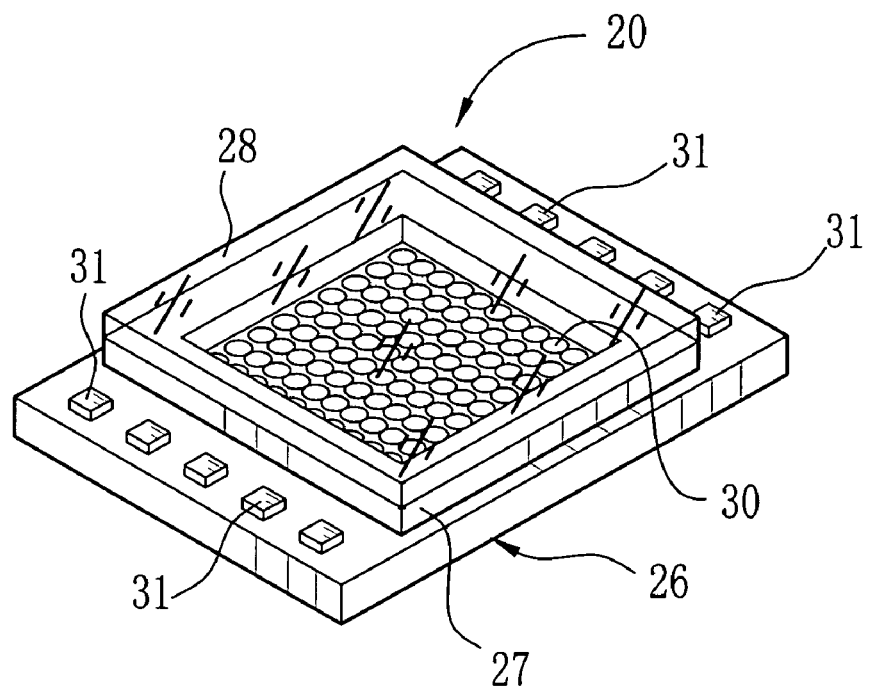
FIG. 4 is a perspective view of a solid state imaging device.
Figure 5:
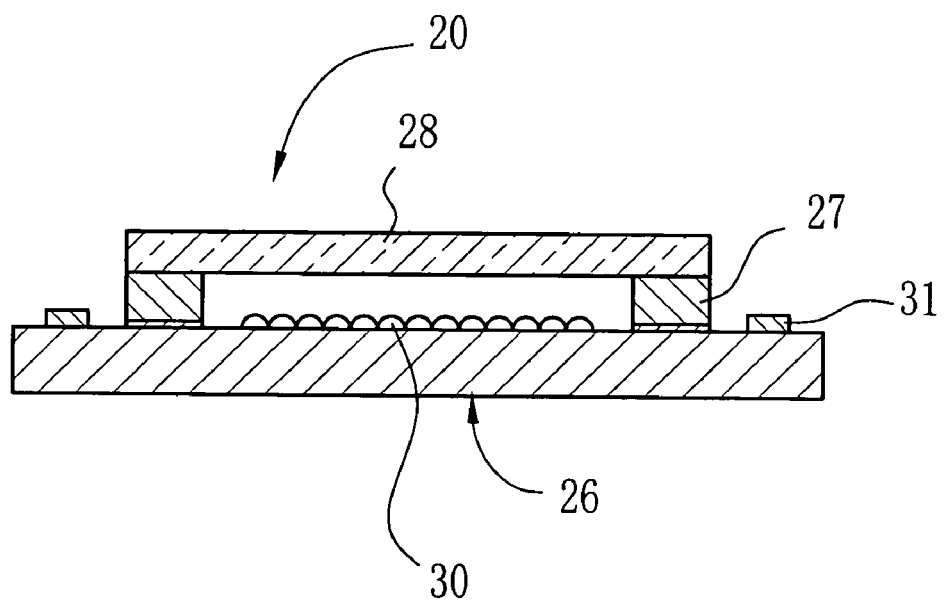
FIG. 5 is a partially sectional view of the solid state imaging device.

As shown in FIG. 4 and FIG. 5, the solid state imaging device 20 is constructed of a semiconductor substrate 26, a frame-like spacer 27 which is adhered on the semiconductor substrate 26 with an adhesive, and a cover glass 28 which is adhered above the spacer 27 so as to seal inside the spacer 27.

On the semiconductor substrate 26, a light receiving portion 30 and a plurality of contact terminals 31 which electrically connect the light receiving portion 30, are provided. The light receiving portion 30 is a CCD (charge coupled device)

type, on which plural pixels (photodiodes) are formed. A micro lens and color filters are superimposed on the each pixel. The contact terminals 31 are formed such that conductive materials are printed on the semiconductor substrate 26, for example. In a similar way, the each contact terminal 31 connects the light receiving portion 30 by printed wiring.

The spacer 27 is formed of inorganic materials such as silicon, and surrounds the light receiving portion 30. A transparent α-ray shielding glass is used as the cover glass 28, so as to prevent the pixels from being destroyed by the α-ray. Since a space between the light receiving portion 30 and the cover glass 28 is provided, the functions of the micro lens do not become worse.

The solid state imaging device 20 is produced as described below, for example. First, the silicon is superimposed on a transparent glass substrate as the substrate of the cover glass 28, and then the plural spacers 27 are formed on the glass substrate by photolithography, development, etching and so on. Next, by the adhesive applied on end faces of the spacers 27, the spacers 27 are adhered on a wafer on which a plurality of the light receiving portions 30 and the contact terminals 31 are formed, such that the each image sensor 30 are closed inside the spacer 27 and the glass substrate. Finally, a plurality of the solid state imaging devices 20 are obtained from dicing of the glass substrate and the wafer.

The optical unit 21 comprises a lens holder 34 and a taking lens 35 which is incorporated in the lens holder 34. The lens holder 34 is formed of for example a plastic, and has a cylindrical lens barrel 34a in which the taking lens 35 are incorporated, and a rectangular recess 34b below the lens barrel 34a. The recess 34b is fitted on the cover glass 28 of the solid state imaging device 20, and is fixed on the cover glass 28 by the adhesive.

The mounting board 22 is a rigid-flexible board which consists of a rigid board 37 formed of a glass epoxy substrate, a ceramic substrate or the like and a flexible board 38 integrated with the rigid board 37. On the rigid board 37, there is an attachment space 39 where the solid state imaging device 20 is attached. The solid state imaging device 20 die bonded on the rigid board 37 is electrically connected to the rigid board 37 by wire bonding. On a rear surface of the rigid board 37, an IC 40 for controlling the solid state imaging device 20 is mounted. The IC 40 is for example a chip of an analog front-end circuit incorporating H driver (V driver), CDS, AGC, ADC and the like.

Attachment holes 44 are provided in four corners of the rigid board 37, for being inserted by the cushions 23 and screws 43 when the rigid board 37 is attached to the outer cover 14. On an inner surface of the outer cover 14, threaded holes 46 are provided at positions corresponding to the attachment holes 44 of the rigid board 37, for being threaded by the screws 43. The cushion 23 comprises half bushes 23a, 23b each of which has an approximately cylindrical shape with a flange and is formed of rubber or sponge rubber. The half bushes 23a, 23b are inserted into the attachment holes 44 from both sides of the rigid board 37. A diameter of an internal thread of the half bushes 23a, 23b corresponds to a diameter of the screw 43. Note that the half bushes 23a, 23b may be combined.

Since the rigid board 37 of the mounting board 22 of the camera module 17 is attached to the outer cover 14 through the cushions 23 and the screws 43, the camera module 17 floats on the cushion 23 inside the mobile phone 2. In addition, the optical unit 21 and the solid state imaging device 20 of the camera module 17 are contained in the opening 15 and do not contact the outer cover 14. Accordingly, even if the mobile phone 2 is dropped down, although the impact is transmitted to the outer cover 14 and the screws 43, the camera module 17 is protected from the large shock because the cushions 23 absorb the shock transmitted from the screws 43. In addition, the camera module 17 is prevented from breakage by the vibration or the shock applied to the mobile phone 2, because the outer cover 14 does not contact to the optical unit 21 and the solid state imaging device 20.

The mounting board 22 of the camera module 17 is a subsidiary substrate of the mobile phone 2, which controls only the image capturing function. Therefore, the mounting board 22 must be connected to a main substrate 47 of the mobile phone 2. For connecting between the mounting board 22 and the main substrate 47, the flexible board 38 is used. According to this construction, even if the mobile phone 2 is dropped down, although the impact is transmitted to the main substrate 47 which is attached to a frame 49 of the mobile phone 2, the shock can not be transmitted to the mounting board 22 from the main substrate.

In general solid state imaging device, output signal from CCD output terminal is amplified by an emitter follower circuit which has a transistor. The emitter follower circuit has a function as a buffer which protects the CCD of the solid state imaging device. This function becomes more effective when the emitter follower circuit is closer to the solid state imaging device. Accordingly, if there is no space for mounting the transistor of the emitter follower circuit on the mounting board 22, it is preferable that a transistor 51 is mounted on the flexible board 38.

Figure 6:
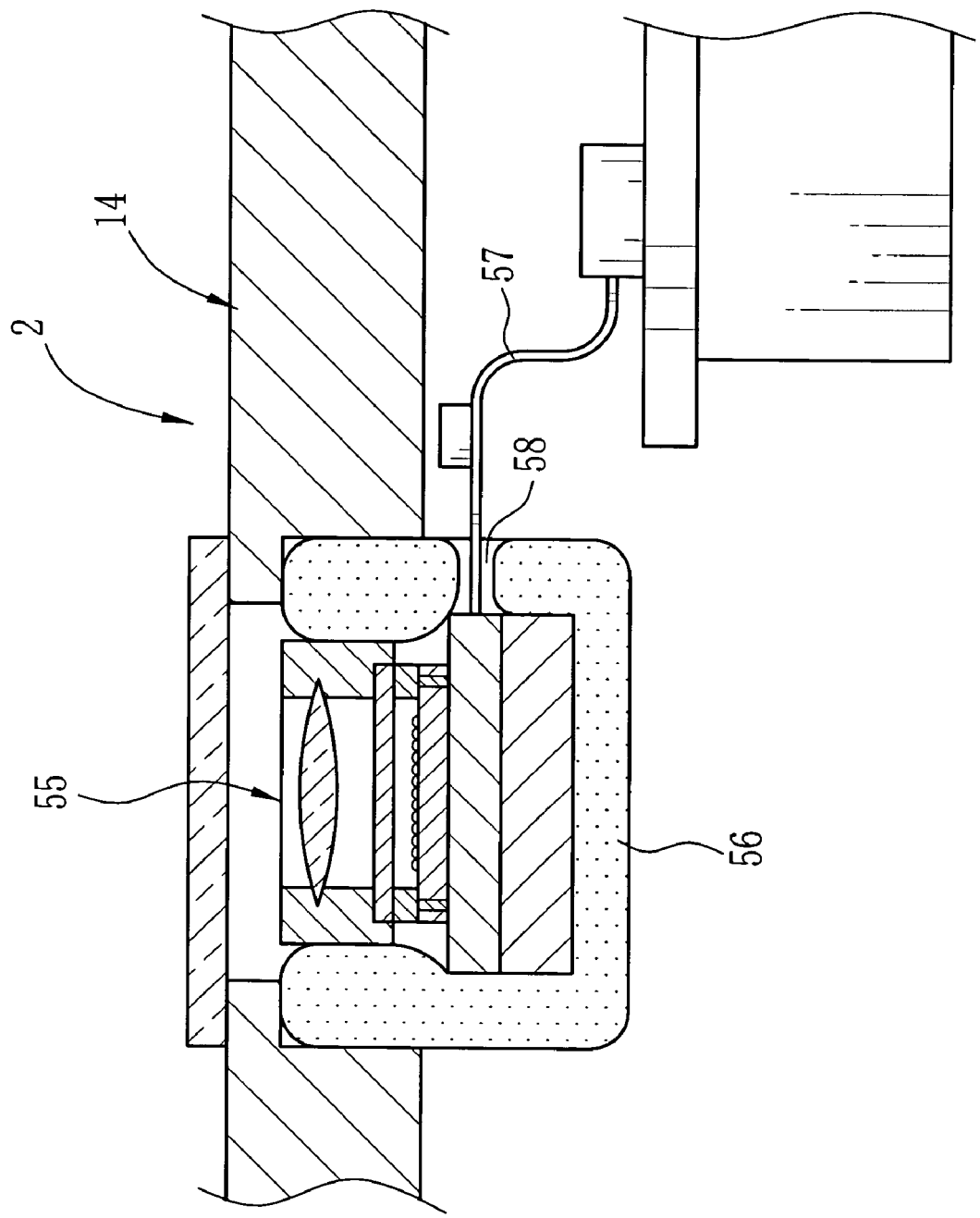
FIG. 6 is a partially sectional view of an image capturing section of a mobile phone of another embodiment.

In the above embodiment, the cushions 23 formed of rubber or sponge rubber are used. However, coil springs may be used such that the two coil springs sandwiches the rigid board 37 and these springs are screwed to the outer cover 14 by the screws 43. In the above embodiment, the mounting board 22 is attached to the outer cover 14 through the cushions 23. However, as shown in FIG. 6, it may be also preferable that a cushion 56 covers around a camera module 55, and a portion of the cushion 56 is attached to the outer cover 14 by the adhesive or so on. In the cushion 56, an opening 58 for being inserted from a flexible board 57 is formed. As the cushion 56 for this construction, bags including gases or fluids for being cushioned may be used in addition to the rubbers and sponges.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. An image capture apparatus comprising:
   a camera module including a solid state imaging device formed such that a light receiving portion is Conned on a semiconductor substrate, a mounting board for mounting said solid state imaging device, and an optical unit attached on said solid state imaging device or said mounting board, and incorporating an image taking optical system for focusing subject images on said light receiving portion;
   an outer cover, to which said camera module is attached, having an opening for exposing said optical unit; and
   a plurality of cushions inserted in said mounting board, and provided between said camera module and said outer cover,
   wherein said optical unit is positioned within said opening, and wherein said mounting board has attachment holes in which said plurality of cushions is inserted, and said outer cover has threaded holes provided at a position corresponding to said attachment holes of said mounting board, for receiving screws which each screw penetrates one of said plurality of cushions.

2. An image capture apparatus as described in claim 1, wherein each of said cushions is positioned between said mounting board and said outer cover, and said solid state imaging device and said optical unit are placed not to contact said outer cover.

3. An image capture apparatus as described in claim 1, wherein each of said plurality of cushions comprises approximately cylindrical half bushes with flange, and said half bushes are respectively inserted into said attachment holes from opposite sides of said mounting board.

4. An image capture apparatus as described in claim 1, wherein said plurality of cushions covers a portion of said camera module without blocking an optical path of said optical unit, and a portion of said cushion is attached to said outer cover.

5. An image capture apparatus as described in claim 1, wherein said mounting board is connected to another electronic component which is disposed inside said outer cover through a flexible wiring.

6. An image capture apparatus as described in claim 5, further comprising a transistor for amplifying an output signal from said solid state imaging device being mounted on said flexible wiring.

7. An image capture apparatus as described in claim 1, further comprising a transparent plate for covering said opening.

8. An image capture apparatus as described in claim 1, wherein said image capture apparatus comprises a mobile phone.

9. An image capture apparatus as described in claim 1, wherein an entirety of said optical unit is positioned within said opening.

10. An image capture apparatus as described in claim 1, wherein the cushion is at least one of a rubber, a sponge rubber, coil springs, and a bag including a gas or fluid.

11. An image capture apparatus as described in claim 1, wherein the plurality of cushions is configured to accommodate an attachment mechanism therethrough.

12. An image capture apparatus as described in claim 1, wherein each of the plurality of cushions comprises at least two cushions, wherein a part of the camera module is sandwiched by the at least two cushions.

13. An image capture apparatus as described in claim 1, wherein said mounting board has at least one attachment hole in which said plurality of cushions is inserted.

14. An image capture apparatus comprising:
a camera module including a solid state imaging device formed such that a light receiving portion is formed on a semiconductor substrate, a mounting board for mounting said solid state imaging device, and an optical unit attached on said solid state imaging device or said mounting board, and incorporating an image taking optical system for focusing subject images on said light receiving portion:
an outer cover, to which said camera module is attached, having an opening for exposing said optical unit; and
a plurality of cushions inserted in said mounting board, and provided between said camera module and said outer cover,
wherein said optical unit is positioned within said opening, and
wherein each of said cushions comprises an approximately cylindrical half bush with a flange, and said half bushes are respectively inserted into an attachment hole from opposite sides of said mounting board.

* * * * *